(12) United States Patent
Saito

(10) Patent No.: US 8,564,372 B2
(45) Date of Patent: Oct. 22, 2013

(54) CIRCUIT FOR COMPENSATING BASE CURRENT OF TRANSISTOR AND AMPLIFIER CIRCUIT PROVIDED WITH THE SAME

(75) Inventor: Akira Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 13/234,029

(22) Filed: Sep. 15, 2011

(65) Prior Publication Data

US 2012/0229218 A1   Sep. 13, 2012

(30) Foreign Application Priority Data

Mar. 9, 2011  (JP) .................................. 2011-50909

(51) Int. Cl.
*H03F 3/04* (2006.01)
(52) U.S. Cl.
USPC .......................................... 330/296; 330/285
(58) Field of Classification Search
USPC ................... 330/296, 285, 288; 323/315, 316
See application file for complete search history.

(56) References Cited

U.S. PATENT DOCUMENTS

| | | | | |
|---|---|---|---|---|
| 7,564,311 B2 * | 7/2009 | Rohani et al. | ................. | 330/285 |
| 7,579,914 B2 * | 8/2009 | Amano | ....................... | 330/296 |
| 7,795,980 B2 * | 9/2010 | Griffiths et al. | ............... | 330/298 |
| 8,253,492 B2 * | 8/2012 | Hijikata et al. | ............... | 330/285 |
| 2011/0234322 A1 * | 9/2011 | Bowers | ......................... | 330/296 |

FOREIGN PATENT DOCUMENTS

JP   2001-168655   6/2001

* cited by examiner

*Primary Examiner* — Henry Choe
(74) *Attorney, Agent, or Firm* — White & Case LLP

(57) ABSTRACT

According to one embodiment, a circuit for compensating fluctuation of a base current of a transistor is presented. The transistor has a base connected with an input terminal. The compensation circuit is provided with a first transistor, a current mirror circuit and a second transistor. The current mirror circuit mirrors a current which is supplied to a base of the first transistor. Further, the current mirror circuit supplies the obtained mirror current to the base of the transistor to be compensated. A base of the second transistor is connected with the input terminal electrically. The second transistor causes an early effect in the first transistor.

15 Claims, 2 Drawing Sheets

US 8,564,372 B2

CIRCUIT FOR COMPENSATING BASE CURRENT OF TRANSISTOR AND AMPLIFIER CIRCUIT PROVIDED WITH THE SAME

CROSS-REFERENCE TO RELATED APPLICATION(S)

This application is based upon and claims the benefit of priority from the prior Japanese Patent Application No. 2011-50909, filed on Mar. 9, 2011, the entire contents of which are incorporated herein by reference.

FIELD

Embodiments described herein relate generally to a circuit for compensating base current of a transistor, and to an amplifier circuit provided with the compensation circuit.

BACKGROUND

A circuit for compensating base current of a bipolar transistor is provided in an input section of an amplifier circuit, for example. The circuit is effective in reducing base current of a bipolar transistor to be compensated which is connected with an input terminal of the amplifier circuit. The circuit is also effective in raising input impedance of the amplifier circuit.

A conventional circuit for compensating base current is provided with a bipolar transistor to generate a compensating current. The bipolar transistor has the same amplification characteristic as the bipolar transistor to be compensated which is connected with an input terminal of an amplifier circuit.

A current Ie2 is flowed through an emitter of the bipolar transistor for generating a compensating current. The current Ie2 has the same amount as an emitter current Ie1 of the transistor to be compensated. Further, a current Ib2 which flows through a base of the transistor for generating a compensating current is mirrored by a current mirror circuit. The obtained mirror current flows into the base of the transistor to be compensated.

In this case, assuming that a current which flows into the base of the transistor to be compensated from the input terminal is denoted by "Iin", a base current Ib1 of the transistor to be compensated is expressed by "Ib1=Iin+Ib2". Accordingly, the current Iin which flows from the input terminal is expressed by "Iin=Ib1−Ib2".

The emitter current Ie2 of the transistor for generating a compensating current has the same amount as the emitter current Ie1 of the transistor to be compensated. Since a collector-emitter voltage Vce2 of the former transistor is same as a collector-emitter voltage Vce1 of the latter transistor, the base current Ib2 of the former transistor becomes same as the base current Ib1 of the latter transistor, i.e., Ib2=Ib1. From the above formula, the current Iin is obtained as "Iin=Ib1−Ib2=0", namely the current Iin which flows from the input terminal is zero, and the input impedance becomes high.

The emitter potential of the transistor to be compensated is a potential which is dropped from an input voltage applied to the input terminal, by an amount of a base-emitter voltage of the transistor. The collector-emitter voltage Vce1 fluctuates in accordance with fluctuation of the input voltage.

Accordingly, the base current Ib1 of the transistor to be compensated fluctuates in accordance with fluctuation of the applied voltage due to an early effect. On the other hand, since the emitter potential of the transistor for generating a compensating current is not influenced by the applied voltage, the collector-emitter voltage Vce2 of the transistor for generating a compensating current does not fluctuate even when the applied voltage fluctuates. As a result, the base current Ib2 of the transistor for generating a compensating current does not fluctuate even when the applied voltage fluctuates.

The conventional circuit for compensating base current has a problem that the subtraction of the base current Ib1 from the base current Ib2 becomes not equal to zero ("Ib2−Ib1≠0") when the voltage applied to the input terminal fluctuates. As a result, the current Iin which flows from the input terminal fluctuates depending on the applied voltage.

DETAILED DESCRIPTION

Figure 1:
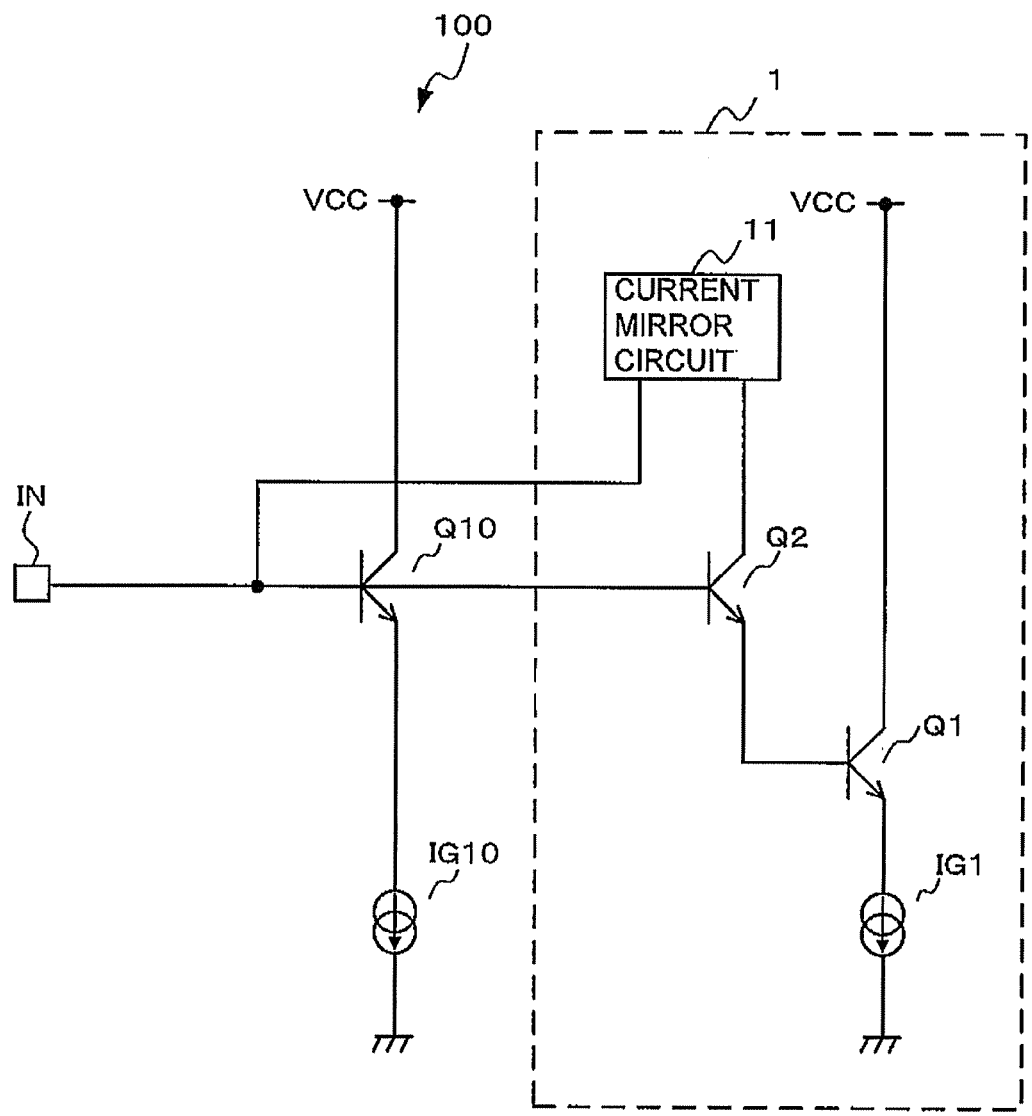
FIG. 1 is a circuit diagram showing a circuit for compensating base current of a transistor and an amplifier circuit according to an embodiment.

According to one embodiment, a compensation circuit for compensating fluctuation of a base current of a transistor is presented. The transistor has a base connected with an input terminal. The compensation circuit is provided with a first transistor, a current mirror circuit and a second transistor. The current mirror circuit mirrors a current which is supplied to a base of the first transistor. Further, the current mirror circuit supplies the obtained mirror current to the base of the transistor to be compensated. A base of the second transistor is connected with the input terminal electrically. The second transistor causes an early effect in the first transistor.

Hereinafter, further embodiments will be described with reference to the drawings.

In the drawings, the same reference numerals denote the same or similar portions respectively.

A first embodiment will be described with reference to FIG. 1.

FIG. 1 is a circuit diagram showing a circuit for compensating base current of a transistor and an amplifier circuit according to an embodiment of the invention.

As shown in FIG. 1, a circuit 1 for compensating base current is provided in an amplifier circuit 100. An NPN bipolar transistor Q10 to be compensated is arranged in the amplifier circuit 100. A base of the transistor Q10 is connected with an input terminal IN of the amplifier circuit 100.

A collector of the transistor Q10 is connected with a terminal VCC of a power supply for applying a predetermined voltage. An emitter of the transistor Q10 is connected with a constant current source IG10. The circuit 1 of the embodiment is connected with an input terminal IN of the amplifier circuit 100, and compensates fluctuation of a base current of the transistor Q10 due to fluctuation in voltage applied to the input terminal IN.

The circuit 1 is provided with an NPN transistor Q1 for generating a compensating current as a first transistor, an NPN transistor Q2 for offsetting an early effect as a second transistor, and a current mirror circuit 11. A collector of the transistor Q1 is connected with a power supply terminal VCC. An emitter of the transistor Q1 is connected with a constant current source IG1. A base of the transistor Q2 is connected with the input terminal IN. The emitter of the transistor Q2 is connected with a base of the transistor Q1. One end of the current mirror circuit 11 is connected with a collector of the transistor Q2. The other end of the current mirror circuit 11 is connected with the base of the transistor Q10 to be compensated.

The transistor Q2 and the transistor Q10 to be compensated have the same amplification characteristic.

The current of the constant current source IG1 is set to have the same amount as the current of the constant current source IG10.

The current mirror circuit 11 outputs a current from the other end. The current from the other end has the same amount as a current which flows through the one end connected with the collector of the transistor Q2.

Figure 2:
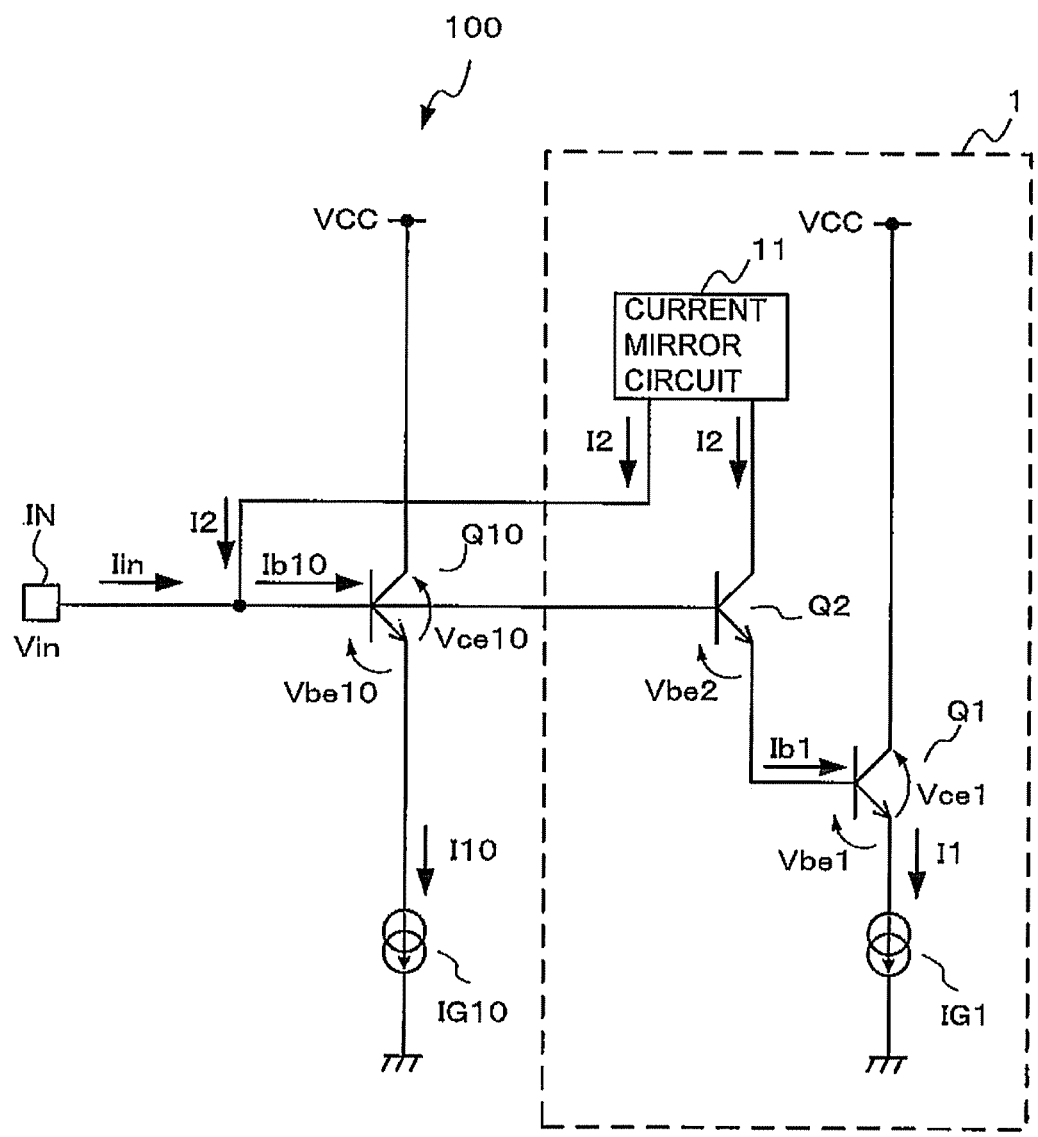
FIG. 2 is a diagram to explain operation of the circuit for compensating base current and the amplifier circuit according to the embodiment.

An operation of the circuit 1 for compensating base current will be described using FIG. 2.

A current I10 of the constant current source IG10 flows through the emitter of the transistor Q10 to be compensated. A current I1 flows through the emitter of the transistor Q1 for generating a compensating current. The current I1 has the same amount as the constant current source IG10.

An emitter potential Ve10 of the transistor Q10 is a potential which is dropped from a voltage Vin which is applied to the input terminal IN, by an amount of a base-emitter voltage Vbe10, as shown in the following formula:

$$Ve10 = Vin - Vbe10$$

Accordingly, the collector-emitter voltage Vce10 of the transistor Q10 fluctuates in accordance with fluctuation of the applied voltage Vin. As a result, a base current Ib10 of the transistor Q10 to be compensated fluctuates in accordance with fluctuation of the applied voltage Vin due to an early effect.

The base of the transistor Q2 for offsetting an early effect is electrically connected with the input terminal IN and the base of the transistor Q10. The emitter of the transistor Q2 is connected with the base of the transistor Q1 for generating a compensating current.

An emitter potential Ve1 of the transistor Q1 is, as shown in the following formula, a potential which is dropped from the voltage Vin which is applied to the input terminal IN, by an amount of subtraction of a base-emitter voltage Vbe2 of the transistor Q2 from the applied voltage Vin:

$$Ve1 = Vin - (Vbe2 + Vbe1)$$

Accordingly, the collector-emitter voltage Vce1 of the transistor Q1 fluctuates in accordance with fluctuation of the applied voltage Vin. Further, fluctuation of the base current Ib1 of the transistor Q1 also occurs in accordance with fluctuation of the applied voltage Vin due to an early effect.

Consequently, fluctuation of the collector current I2 of the transistor Q2 also occurs in accordance with fluctuation of the applied voltage Vin. This current I2 is mirrored by the current mirror circuit 11, and the mirrored current is supplied into the base of the transistor Q10 to be compensated.

Assuming that the current which flows from the input terminal IN into the base of the transistor Q10 is denoted by "Iin", the base current Ib10 of the transistor Q10 is expressed as follows.

$$Ib10 = Iin + I2$$

Accordingly, the current Iin which flows from the input terminal is expressed as follows:

$$Iin = Ib10 - I2$$

The same early effects occur in the current Ib10 and the current I2 respectively so that the early effects are offset based on the formula "Ib10−I2". With the offset of the early effect, the current Iin which flows from the input terminal IN does not show dependency on the applied voltage.

According to the embodiment as described above, a current which flows from the input terminal can be made constant even when the applied voltage fluctuates.

According to the circuit for compensating base current presented by the embodiment, a current which flows from the input terminal can be made constant even when the voltage applied to the input terminal fluctuates.

The NPN bipolar transistors are used as transistors in the above embodiment, PNP bipolar transistors may also be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A circuit for compensating fluctuation of a base current of a transistor which has a base connected with an input terminal, comprising:
   a first transistor;
   a current mirror circuit to mirror a current being supplied to a base of the first transistor and to supply the obtained mirror current to the base of the transistor to be compensated; and
   a second transistor, a base of the second transistor being connected with the input terminal electrically, the second transistor causing an early effect in the first transistor and wherein the base of the second transistor and base of the transistor to be compensated are connected to the input terminal.

2. The circuit according to claim 1, wherein the second transistor causes an early effect in the first transistor, the early effect being substantially the same as an early effect which is caused in the transistor to be compensated.

3. The circuit according to claim 1, wherein the input terminal is connected with the transistor to be compensated.

4. The circuit according to claim 1, wherein an emitter of the second transistor is connected with the base of the first transistor, and a collector of the second transistor is connected with the current mirror circuit.

5. The circuit according to claim 1, further comprising a power supply for applying a voltage and a current source for supplying a constant current, wherein the power supply is connected with a collector of the first transistor, and the current source is connected with an emitter of the first transistor.

6. An amplifier circuit provided with an input terminal, and a transistor having a base connected with the input terminal and to be compensated for fluctuation of a base current, comprising:
   a first transistor;
   a current mirror circuit to mirror a current being supplied to a base of the first transistor and to supply the obtained mirror current to the base of the transistor to be compensated; and
   a second transistor, a base of the second transistor being connected with the input terminal electrically, the second transistor causing an early effect in the first transistor and wherein the base of the second transistor and base of the transistor to be compensated are connected to the input terminal.

7. The circuit according to claim 6, wherein the second transistor causes an early effect in the first transistor, the early effect being substantially the same as an early effect which is caused in the transistor to be compensated.

8. The circuit according to claim 6, wherein an emitter of the second transistor is connected with the base of the first transistor, and a collector of the second transistor is connected with the current mirror circuit.

9. The circuit according to claim 8, further comprising a power supply for applying a predetermined voltage, wherein the power supply is connected with respective collectors of the transistor to be compensated and the second transistor.

10. The circuit according to claim 9, further comprising constant current sources, wherein the constant current sources supply currents of the same amount to emitters of the transistor to be compensated and an emitter of the first transistor, respectively.

11. The circuit according to claim 6, further comprising a power supply for applying a predetermined voltage and constant current sources for supplying currents of the same amount, wherein
an emitter of the second transistor is connected with a base of the first transistor,
a collector of the second transistor is connected with the current mirror circuit,
the power supply is connected with respective collectors of the transistor to be compensated and the second transistor, and
the constant current sources is connected with an emitter of the transistor to be compensated and an emitter of the first transistor to supply the currents to the emitters respectively.

12. The circuit according to claim 6, wherein the transistor to be compensated and the first transistor have the same amplification characteristic.

13. The circuit according to claim 1, further comprising a power supply for applying a voltage, and a current source for supplying a constant current, wherein an emitter of the second transistor is connected with the base of the first transistor, a collector of the second transistor is connected with the current mirror circuit, the power supply is connected with a collector of the first transistor, and the current source is connected with an emitter of the first transistor.

14. The circuit according to claim 1, wherein the current mirror circuit is connected with the base of the transistor to be compensated.

15. The circuit according to claim 11, wherein the current mirror circuit is connected with the base of the transistor to be compensated.

* * * * *